United States Patent
Lou

(10) Patent No.: US 12,405,290 B2
(45) Date of Patent: Sep. 2, 2025

(54) PROBE TESTING DEVICE HAVING ELASTIC STRUCTURE

(71) Applicant: STAR TECHNOLOGIES (WUHAN) CO., LTD., Wuhan (CN)

(72) Inventor: Choon Leong Lou, Singapore (SG)

(73) Assignee: STAR TECHNOLOGIES (WUHAN) CO., LTD., Wuhan (CN)

( * ) Notice: Subject to any disclaimer, the term of this patent is extended or adjusted under 35 U.S.C. 154(b) by 432 days.

(21) Appl. No.: 17/728,986

(22) Filed: Apr. 26, 2022

(65) Prior Publication Data
US 2023/0194570 A1    Jun. 22, 2023

(30) Foreign Application Priority Data
Dec. 17, 2021    (CN) .......................... 202111552633.X

(51) Int. Cl.
*G01R 1/073*    (2006.01)
(52) U.S. Cl.
CPC ..... *G01R 1/07357* (2013.01); *G01R 1/07314* (2013.01)
(58) Field of Classification Search
None
See application file for complete search history.

(56) References Cited

U.S. PATENT DOCUMENTS

| | | | | |
|---|---|---|---|---|
| 2004/0061513 | A1* | 4/2004 | Sweet | G01R 1/06772 324/755.05 |
| 2009/0102495 | A1* | 4/2009 | Kister | G01R 1/07314 324/750.16 |
| 2015/0015289 | A1* | 1/2015 | Eldridge | G01R 1/06733 324/754.03 |
| 2018/0088150 | A1* | 3/2018 | Kuga | G01R 1/07314 |
| 2019/0064215 | A1* | 2/2019 | Park | H01R 13/2407 |
| 2019/0170817 | A1* | 6/2019 | Uebayashi | G01R 1/07357 |

FOREIGN PATENT DOCUMENTS

| | | |
|---|---|---|
| TW | 201237438 A1 | 9/2012 |
| TW | 201913104 A | 4/2019 |

* cited by examiner

*Primary Examiner* — Nasima Monsur
(74) *Attorney, Agent, or Firm* — Li & Cai Intellectual Property Office

(57) ABSTRACT

A probe testing device having an elastic structure is provided. The probe testing device having the elastic structure includes a plurality of probe elements and a guide plate module. Each of the probe elements includes a body, a first contact segment, and a second segment, and is formed integrally. The guide plate module includes a first guide plate, a second guide plate, and a third guide plate that are parallel to each other, and the third guide plate is arranged between the first guide plate and the second guide plate. The plurality of probe elements correspondingly pass through the first guide plate, the second guide plate, and the third guide plate. The third guide plate is configured to perform a parallel movement relative to the first guide plate and the second guide plate in a direction perpendicular to an axis of the probe element.

6 Claims, 14 Drawing Sheets

PROBE TESTING DEVICE HAVING ELASTIC STRUCTURE

CROSS-REFERENCE TO RELATED PATENT APPLICATION

This application claims the benefit of priority to China Patent Application No. 202111552633.X, filed on Dec. 17, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe testing device, and more particularly to a probe testing device having an elastic structure.

BACKGROUND OF THE DISCLOSURE

With the advance of semiconductor process technology, the size of the wafer is getting smaller. Therefore, the size of the probes of the probe card for testing the electrical characteristics of the integrated circuit needs to be miniaturized, but the probe should still have the ability to withstand stress.

A conventional three-piece elastic probe (e.g., a pogo pin) includes a plunger, a barrel, and a spring. However, an additional spring needs to be arranged in the barrel, which results in a physical limit to the development of the miniaturization of the elastic probe. In addition, the arrangement of the spring in the elastic probe limits an effective area of the elastic probe for providing current flow. Further, the same elastic force of an upper contact and a lower contact of the elastic probe may cause varying pressure to a device to be tested or a test substrate, which is not easy to adjust, resulting in a path of the current flow being easily blocked. As a result, a parasitic inductance value or a parasitic resistance value is accordingly increased, which affects accuracy and reliability of a high-frequency circuit testing.

A conventional conductive elastomer, such as an anisotropic conductive elastomer (ACE), includes an elastic caoutchouc and conductive balls which are arranged in the elastic caoutchouc. The stress generated when the probe testing is performed compresses the elastic caoutchouc, which causes the conductive balls to contact each other so as to be electrically conductive. The conductive elastomer has excellent electrical conductivity and is suitable for high-frequency testing. However, the conductive elastomer is not resistant to high temperature, and has shorter service life than the elastic probe. In addition, a density of the conductive balls and a state of the contact between the conductive balls that are pressed together affect an overall electrical property of the conductive elastomer.

Therefore, how to improve a structural design so as to overcome the above issues, has become one the important issues to be addressed in the related field.

SUMMARY OF THE DISCLOSURE

In response to the above-referenced technical inadequacies, the present disclosure provides a probe testing device having an elastic structure.

In one aspect, the present disclosure provides a probe testing device having an elastic structure, which includes a plurality of probe elements and a guide plate module. Each of the plurality of probe elements includes a first contact segment, a second contact segment, and a body. The first contact segment is arranged at a first end of the probe element, the second contact segment is arranged at a second end of the probe element, and the body is arranged between the first contact segment and the second contact segment. The body includes a plurality of needle structures, and two adjacent ones of the needle structures have a gap arranged therebetween. The plurality of the needle structures are connected to each other through the first contact segment arranged at the first end of the probe element and the second contact segment arranged at the second end of the probe element. The body, the first contact segment, and the second contact segment are integrally formed. The guide plate module includes a first guide plate, a second guide plate, and a third guide plate. The first guide plate has a plurality of first through holes, the second guide plate has a plurality of second through holes, and the third guide plate has a plurality of third through holes. The first guide plate, the second guide plate, and the third guide plate are parallel to each other, and the third guide plate is arranged between the first guide plate and the second guide plate. The plurality of first through holes, the plurality of second through holes, and the plurality of third through holes correspond to each other. Each of the plurality of probe elements passes through a corresponding one of the plurality of first through holes, a corresponding one of the plurality of second through holes, and a corresponding one of the plurality of third through holes, so that an end of the first contact segment protrudes from the first guide plate, an end of the second contact segment protrudes from the second guide plate, and a central axis of the body correspondingly passes through the first guide plate, the second guide plate, and the third guide plate. The third guide plate is configured to perform a parallel movement relative to the first guide plate and the second guide plate in a direction perpendicular to an axis of each of the plurality of probe elements.

In certain embodiments, when the third is configured to perform the parallel movement relative to the first guide plate and the second guide plate in the direction perpendicular to the axis of each of the plurality of probe elements, each of the first contact segment and the second contact segment is aligned with the central axis, and a part of the body that is displaced by the third guide plate is away from the central axis.

In certain embodiments, when the probe element is subjected to an external force, a part of the body that is displaced by the third guide plate extends in a direction of the parallel movement.

In certain embodiments, the plurality of probe elements generated resilience in response the parallel movement of the third guide plate. The first contact segment has a first elastic force, the second contact segment has a second elastic force, and the first elastic force is the same as or different from the second elastic force.

Therefore, in the probe testing device having the elastic structure provided by the present disclosure, by virtue of "the body, the first contact segment, and the second contact segment are integrally formed to be the elastic structure", "each of the plurality of probe elements passing through the corresponding one of the plurality of first through holes, the corresponding one of the plurality of second through holes, and the corresponding one of the plurality of third through holes, so that the end of the first contact segment protrudes from the first guide plate, the end of the second contact segment protrudes from the second guide plate, and a center part of the body passes through the third guide plate", and "the third guide plate being configured to perform the parallel movement relative to the first guide plate and the second guide plate in the direction perpendicular to the axis of each of the plurality of probe elements", a size of probe element can be effectively reduced and pin jamming due to misalignment under different temperatures can be avoided. In addition, a self-inductance can be effectively decreased, thereby improving accuracy and reliability of circuit testing, and extending a product life.

Further, in the probe testing device having the elastic structure provided by the present disclosure, the first elastic force of the first contact segment and the second elastic force of the second contact segment in relation to the probe element as a whole are independent from each other, so that the first contact segment and the second contact segment are not easily to be misaligned and are able to stably contact an object to be tested and a substrate, respectively, thereby preventing the object to be tested or the substrate from being damaged due to excessive contact pressure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
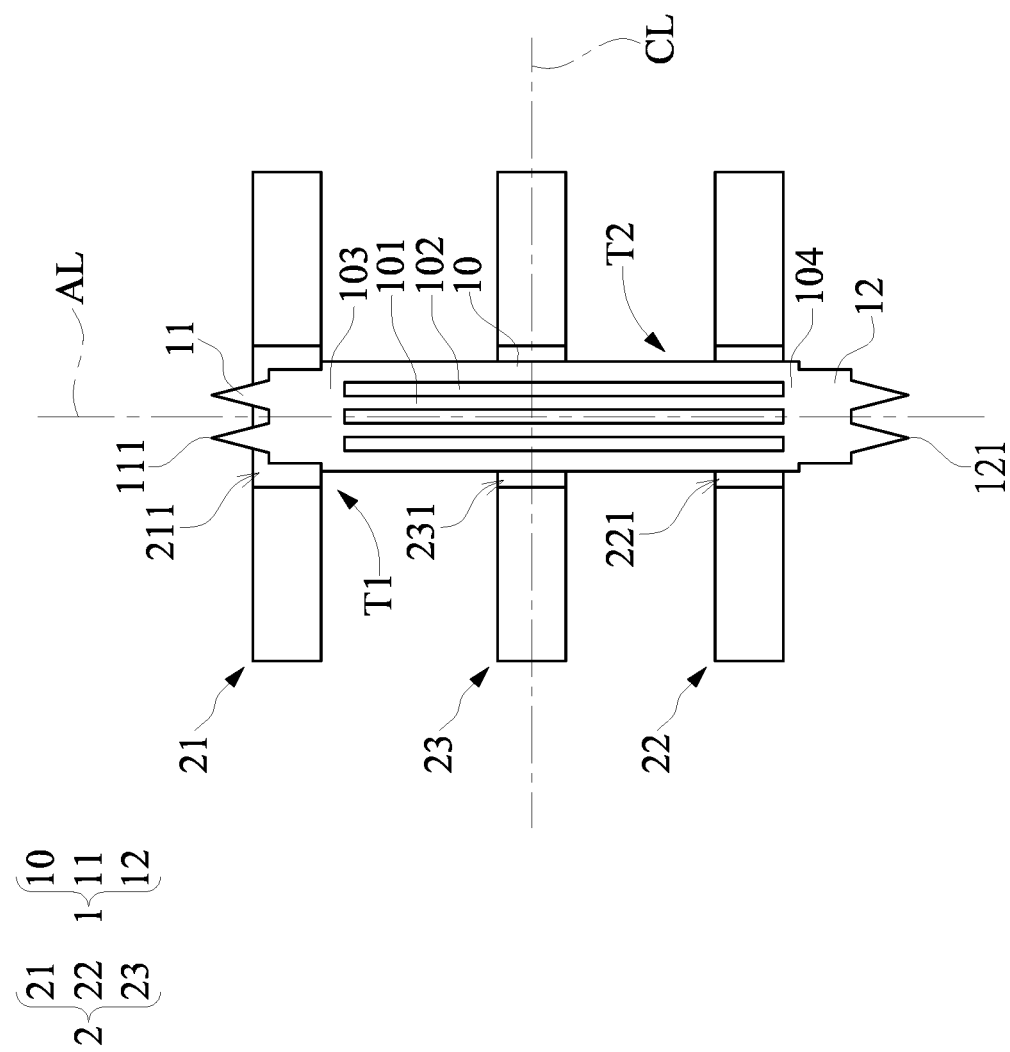
FIG. 1 is a schematic cross-sectional view of a probe testing device having an elastic structure according to a first embodiment of the present disclosure.
Figure 2:
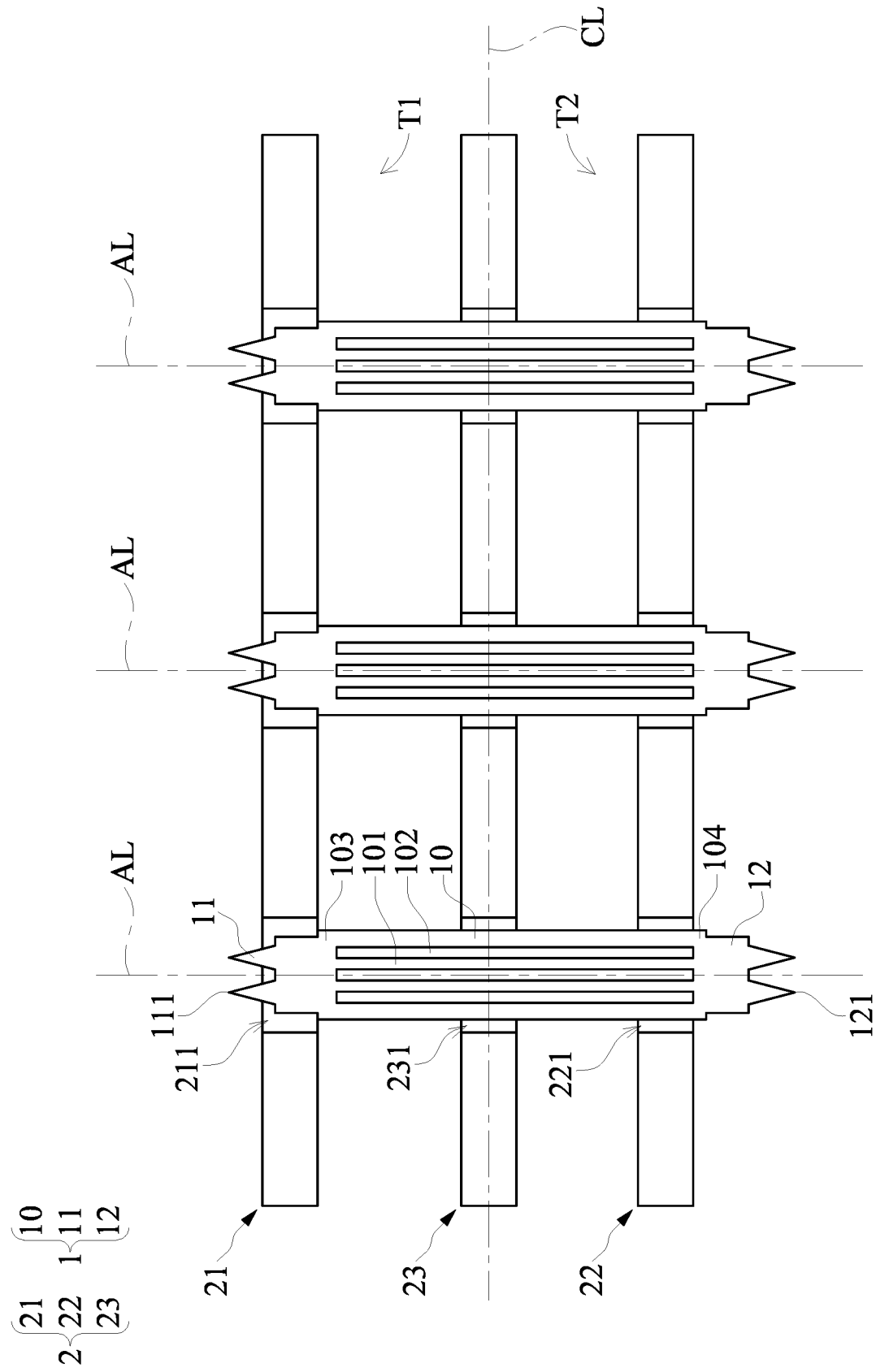
FIG. 2 is a schematic cross-sectional view of the probe testing device having the elastic structure including a plurality of probe elements according to the first embodiment of the present disclosure.
Figure 3:
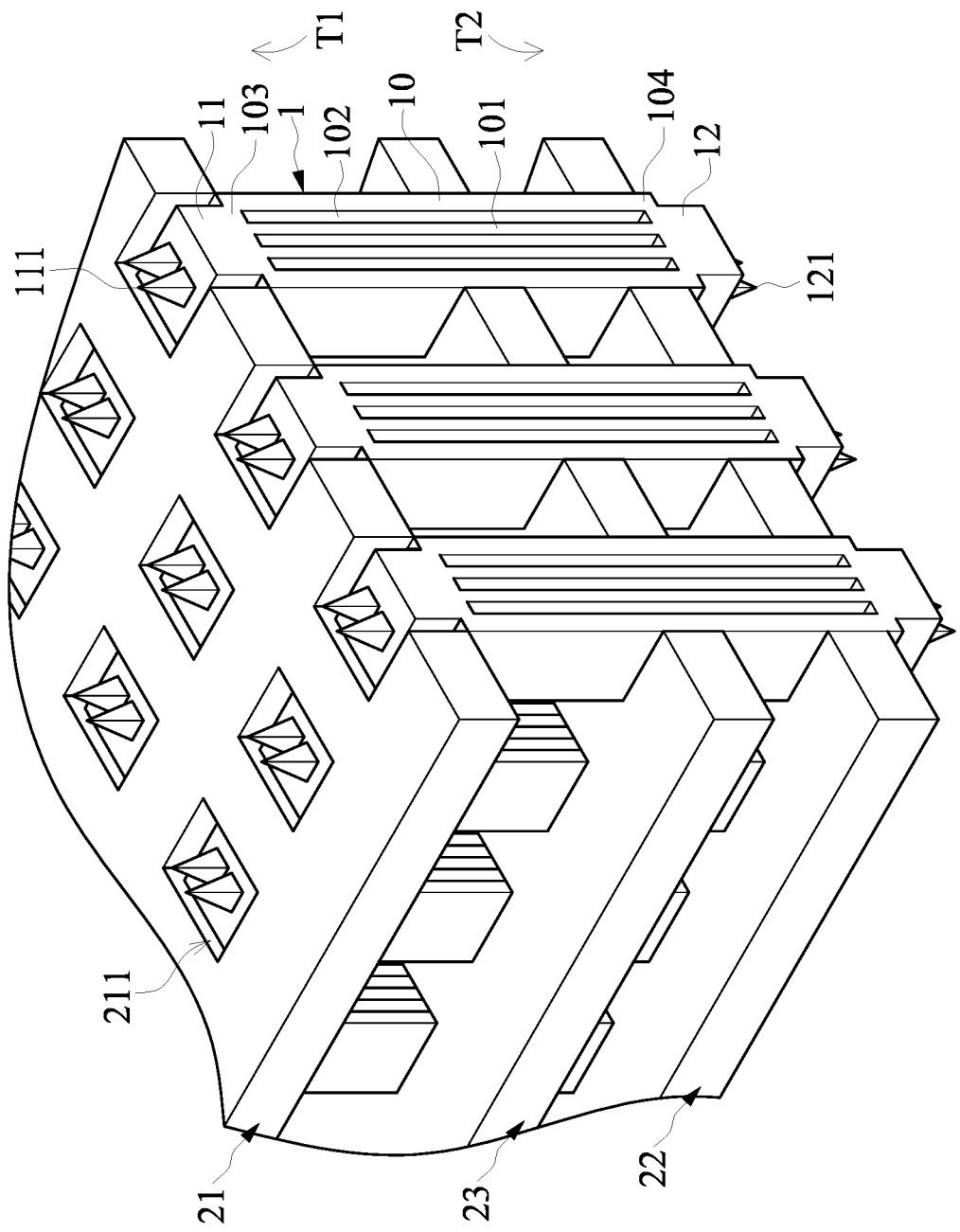
FIG. 3 is a schematic perspective view of the probe testing device having the elastic structure according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 7, a first embodiment of the present disclosure provides a probe testing device having an elastic structure, which includes a plurality of probe elements 1 and a guide plate module 2.

Each of the plurality of probe elements 1 has a body 10, a first contact segment 11, and a second contact segment 12. Specifically, the body 10, the first contact segment 11, and the second contact segment 12 refer to different sections of the probe element 1. In terms of a center line CL of the probe element 1, the probe element 1 has a first end T1 and a second end T2 that are opposite to each other, the body 10 has a plurality of needle structures 101, which are parallel to and separate from each other, arranged between the first end T1 and the second end T2, and adjacent two needle structures 101 have at least one gap 102 arranged therebetween, but the present disclosure is not limited thereto. The body 10 has a first connection part 103 toward the first end T1, and a second connection part 104 toward the second end T2. Two ends of each of the plurality of needle structures 101 are respectively connected to the first connection part 103 and the second connection part 104. The first contact segment 11 extends along the first end T1, and the second contact segment 12 extends along the second end T2. In one particular embodiment, the probe element 1 is integrally formed, that is, the body 10, the first contact segment 11, and the second contact segment 12 are integrally formed by an electrical conductor. In addition, the present is not limited to a way the probe element 1 is formed. For example, the probe element 1 can be formed by a microelectromechanical process, an electroforming process, or a process of laser cutting.

Further, the probe element 1 is an elastic structure, which can produce a bending deformation after the probe element 1 is subjected to an external force F in a same direction as an axial direction of the probe element 1 and the external force F exceeds a critical load of the probe element 1, so as to prevent a probe from being compressed by the external force F and fractured. In one particular embodiment, the probe element 1 can be made of a material with highly electrical conductivity and the high strain property, such as tungsten (W), rhenium-tungsten (ReW), beryllium-copper (BeCu), palladium (HP7), palladium-silver (HC4), tungsten carbide (WC), or alloys thereof, but is not limited thereto.

Figure 4A:
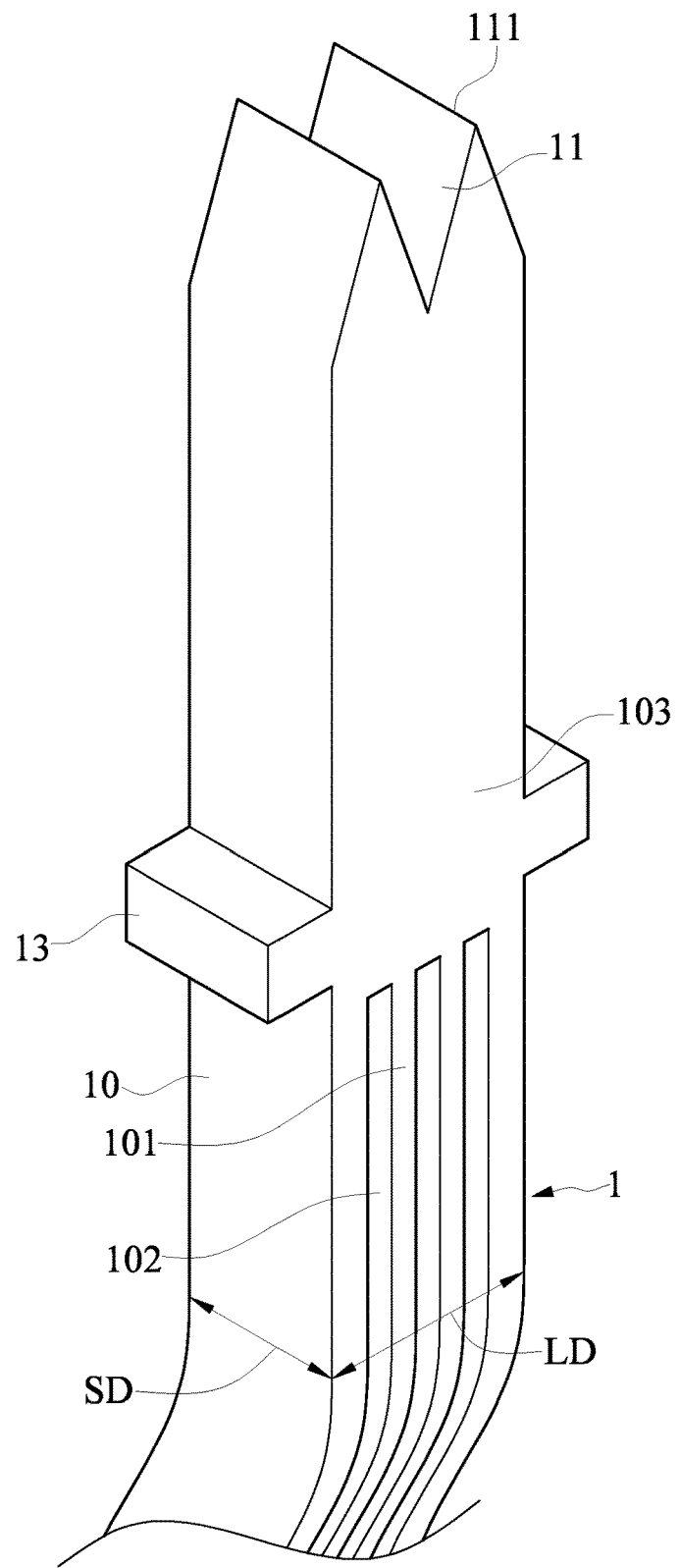
FIG. 4A is a partial perspective view of a first contact segment of the probe element according to the first embodiment of the present disclosure.
Figure 5A:
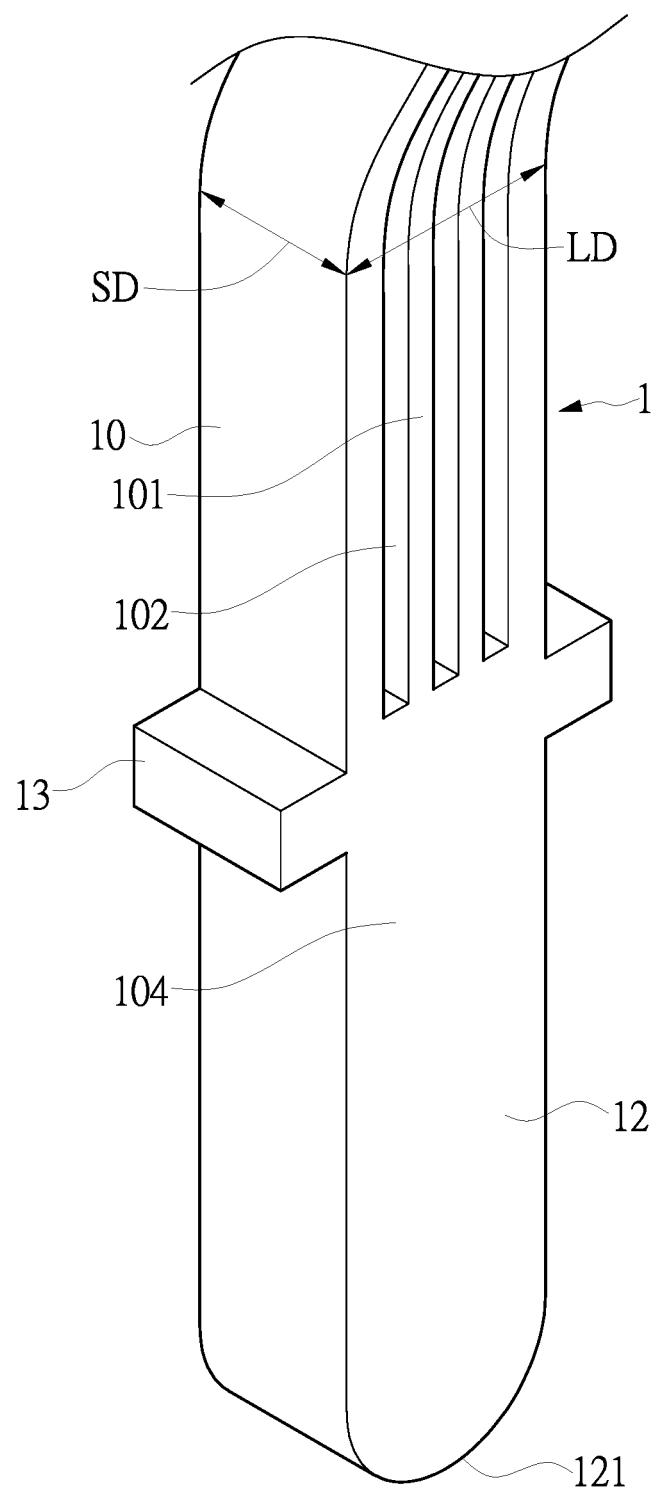
FIG. 5A is a partial perspective view of a second contact segment of the probe element according to the first embodiment of the present disclosure.

A cross-section of the body 10 can be adjusted according to user's needs. In one particular embodiment, the cross-section of the body 10 is strip-shaped, and the strip-shaped cross-section of the body 10 has a long side and a short side. As shown in FIG. 4A and FIG. 5A, a length of the long side is a long side length LD, and a length of the short side is a short side length SD. Preferably, a ratio of the long side length LD to the short side length SD is 3:2, and, for example, when the long side length LD is 150 µm, the short side length SD is 100 µm. The ratio of the long side length LD to the short side length SD can be adjusted according to the user's needs, for example, the ratio of the long side length LD to the short side length SD that can be applied for easily deforming the probe element 1 is 7:1, 7:2, 3:1, 5:2, or 2:1.

Figure 4B:
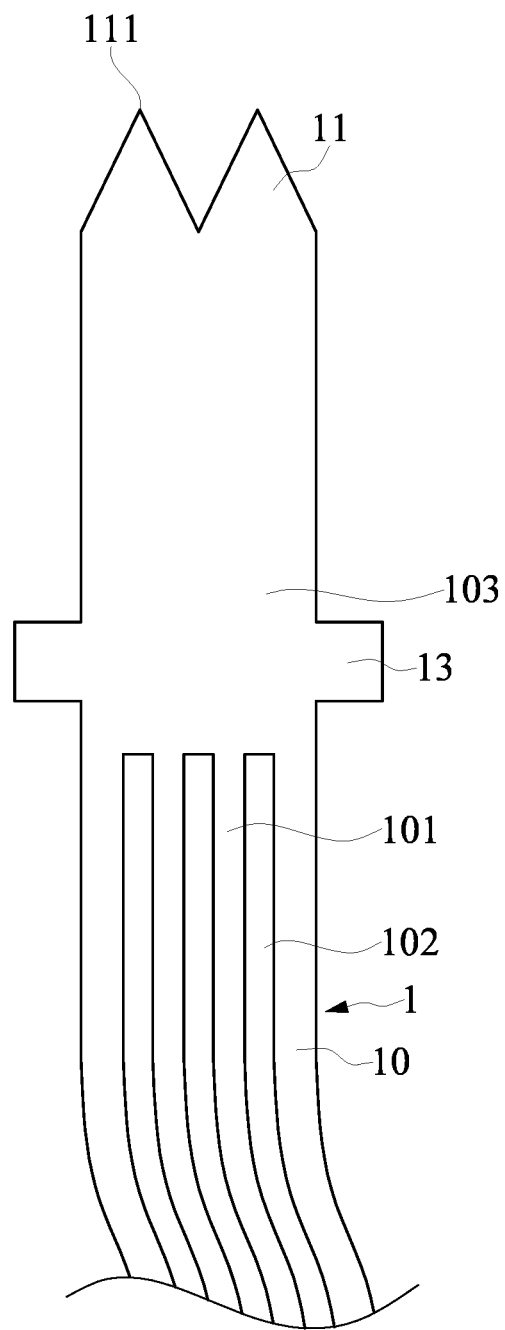
FIG. 4B is a partial cross-sectional view of the first contact segment of the probe element according to the first embodiment of the present disclosure.
Figure 5B:
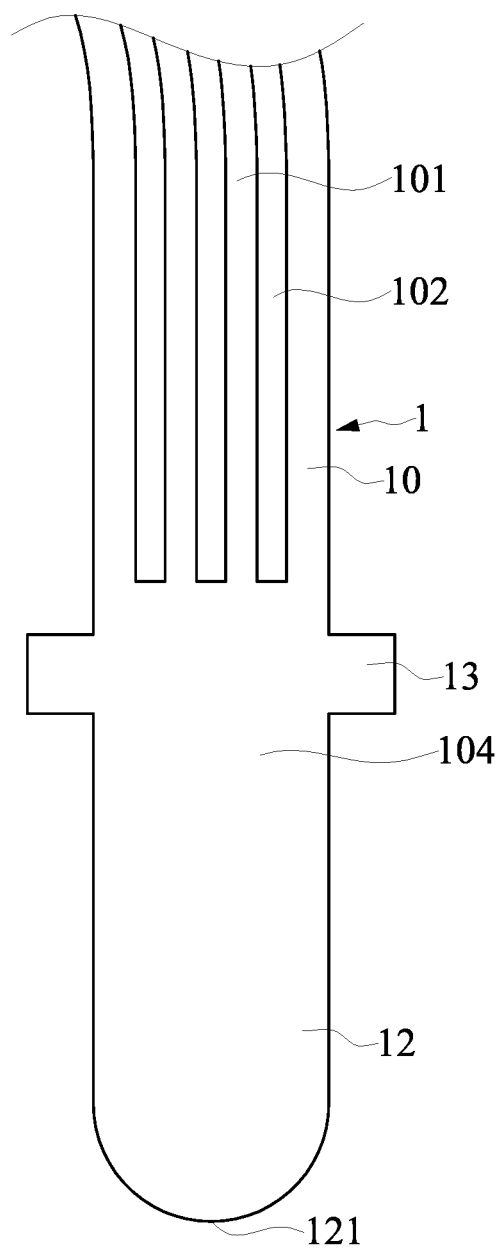
FIG. 5B is a partial cross-sectional view of the second contact segment of the probe element according to the first embodiment of the present disclosure.

Each of the first contact segment 11 and the second segment 12 serves as a contact for an electrical connection to an external element. For example, a first contact end 111 of the first contact segment 11 is used for abutting against an object to be tested (not shown in the figures), and a second contact end 121 of the second contact segment 12 is used for abutting against a substrate. A shape of each of the first contact end 111 and the second contact end 121 can be adapted to a shape of an abutting portion of the object to be tested or the substrate. For example, the shape of each of the first contact end 111 and the second contact end 121 can be formed to be at least one tapered portion, at least one blunt portion, or at least one concave portion, so as to contact a solder pad, a bump, or a solder ball on the object to be tested or the substrate. As shown in FIG. 4A and FIG. 4B (a projection 13 is also shown in FIG. 4A and FIG. 4B, and the details of the projection 13 can be referred to Second Embodiment and Third Embodiment), the first contact end 111 extends along the first end T1 and has two tapered portions formed to abut against the object to be tested. As shown in FIG. 5A and FIG. 5B (the projection 13 is also shown in FIG. 5A and FIG. 5B, and the details of the projection 13 can be referred to the Second Embodiment and the Third Embodiment), the second contact end 121 extends along the second end T2 and has one blunt portion formed to abut against the substrate. In addition, the blunt portion can be rounded, square, or rounded square, but the present disclosure is not limited thereto.

The guide plate module 2 at least includes a first guide plate 21, a second guide plate 22, and a third guide plate 23. The second guide 22 is arranged on a side of the first guide plate 21, the third guide plate 23 is arranged between the first guide plate 21 and the second guide plate 22, and the first guide plate 21, the second guide plate 22, and the third guide plate 23 are parallel to each other. The first guide plate 21 has a plurality of first through holes 211, the second guide plate 22 has a plurality of second through holes 221, and the third guide plate 23 has a plurality of third through holes 231. The plurality of first through holes 211, the plurality of second through holes 221, and the plurality of third through holes 231 correspond to each other, so that each of the plurality of probe elements 1 is allowed to pass through guide plate module 2 through a corresponding one of the plurality of first through holes 211, a corresponding one of the plurality of second through holes 221, and a corresponding one of the plurality of third through holes 231. In other words, the plurality of third through holes 231 are arranged between the plurality of first through holes 211 and the plurality of second through holes 221, the plurality of first through holes 211 respectively correspond to the plurality of third through holes 231, the plurality of third through holes 231 respectively correspond to the plurality of second through holes 221, and the plurality of first through holes 211 respectively correspond to the plurality of second through holes 221. Accordingly, each of the plurality of probe elements 1 can sequentially pass through the corresponding one of the plurality of first through holes 211, the corresponding one of the plurality of third through holes 231, and the corresponding one of the plurality of second through holes 221, or each of the plurality of probe elements 1 can sequentially pass through the corresponding one of the plurality of second through holes 221, the corresponding one of the plurality of third through holes 231, and the corresponding one of the plurality of first through holes 211.

Further, the plurality of first through holes 211, the plurality of second through holes 221, and the plurality of third through holes 231 can be arranged in a predetermined pattern correspondingly on the first guide plate 21, the second guide plate 22, and the third guide plate 23. The predetermined pattern can be a rectangular array or an annular array, but the present disclosure is not limited thereto. In addition, a shape of each of the plurality of first through holes 211, the plurality of second through holes 221, and the plurality of third through holes 231 can be adjusted according to the shape of the cross-section of the body 10 of the probe element 1. According to the above, in one particular embodiment, the cross-section of the body is strip-shaped, so that the shape of each of the plurality of first through holes 211, the plurality of second through holes 221, and the plurality of third through holes 231 can be adapted to be strip-shaped, thereby allowing each of the plurality of probe elements 1 to closely and stably pass through the corresponding one of the plurality of first through holes 211, the corresponding one of the plurality of second through holes 221, and the corresponding one of the plurality of third through holes 231.

In the present embodiment, each of the plurality of probe elements 1 passes through the guide plate module 2 sequentially through the corresponding one of the plurality of second through holes 221, the corresponding one of the plurality of third through holes 231, and the corresponding one of the plurality of first through holes 211 along an extension direction of the first contact segment 11. In addition, the first contact end 111 protrudes from the first guide plate 21, the second contact end 121 protrudes from the second guide plate 22, a peripheral portion of the center line CL of the probe element 1 passes through the third guide plate 23, and a central axis AL of the body 10 correspondingly passes through the first guide plate 21, the second guide plate 22, and the third guide plate 23. In this way, the third guide plate 23 can parallelly move relative to the first guide plate 21 and the second guide plate 22 in a direction perpendicular to an axis of the probe element 1.

Figure 6:
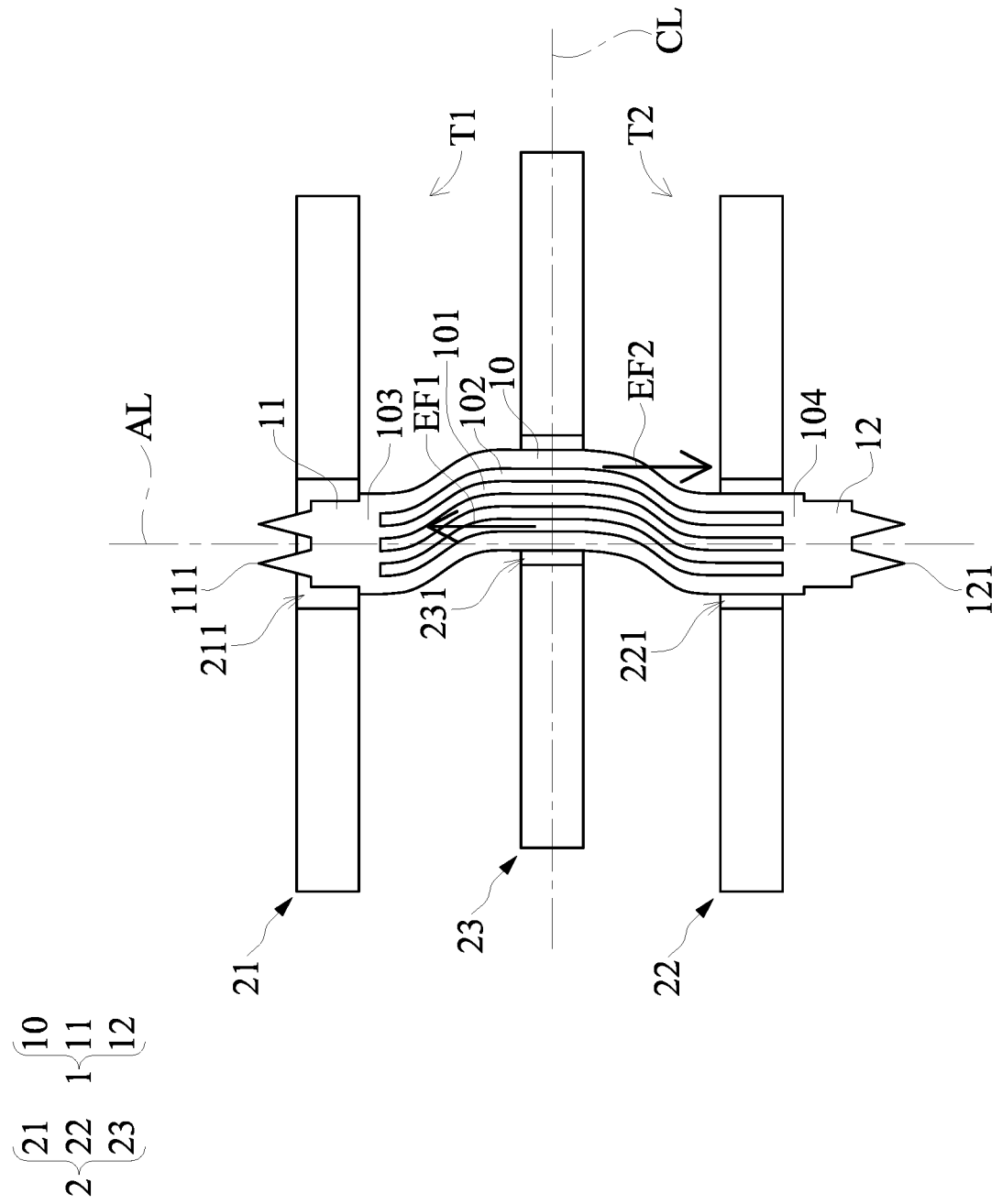
FIG. 6 is a schematic cross-sectional view of the probe testing device having the elastic structure in a state of use according to a first embodiment of the present disclosure.
Figure 7:
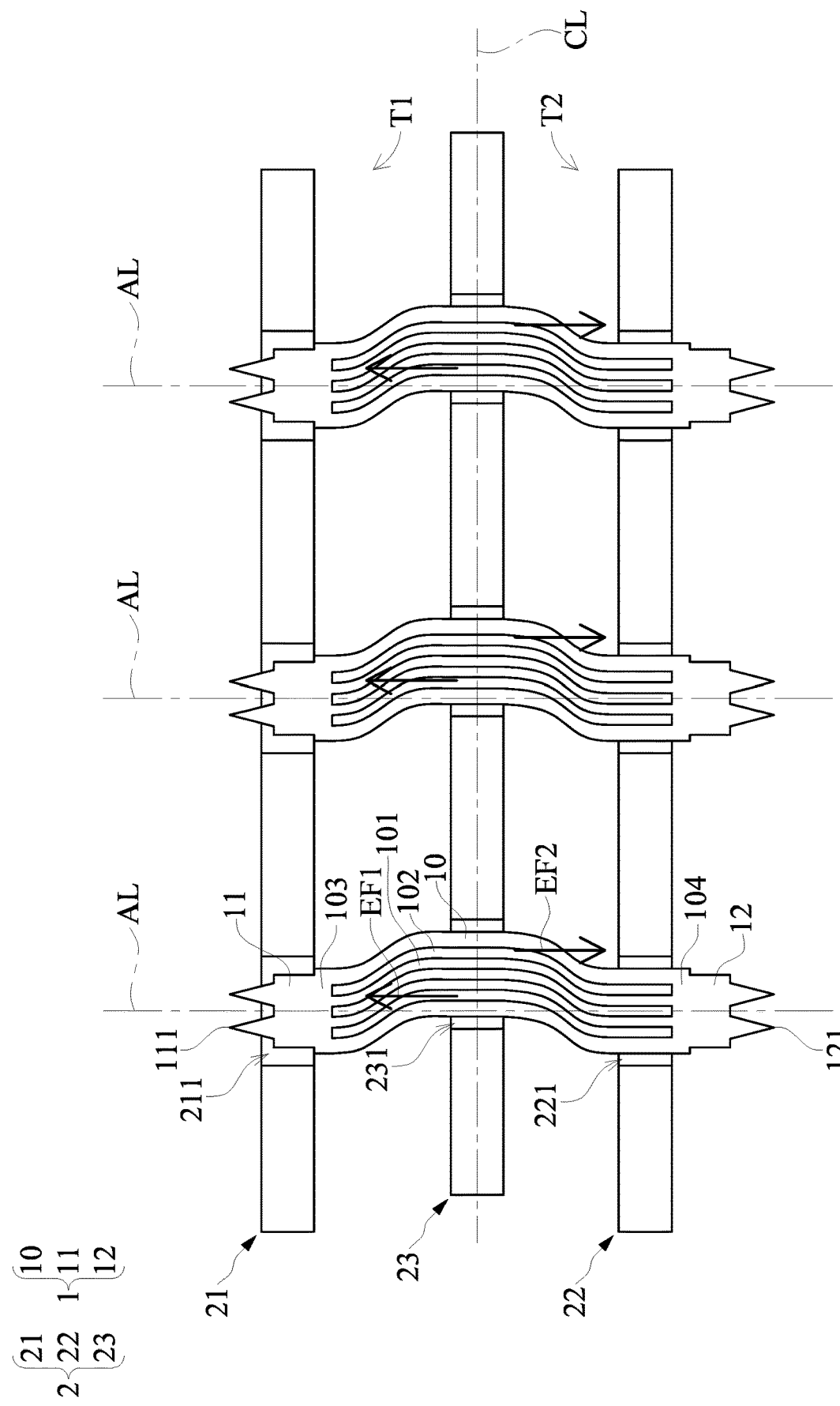
FIG. 7 is a schematic cross-sectional view of the probe testing device having the elastic structure including the plurality of probe elements in a state of use according to a first embodiment of the present disclosure.

Specifically, as shown in FIG. 6 and FIG. 7, when first contact end 111 abuts against the object to be tested and/or the second contact end 121 abuts the substrate, and the external force F in the axial direction exceeds the critical load of the probe element 1, the peripheral portion of the center line CL of the probe element 1 passing through the third guide plate 23 drives the body 10 and the third guide plate 23 to perform a parallel movement relative to each of the first guide plate 21 and the second guide plate 22. Therefore, a first deformation is generated between the first contact segment 11 and the body 10, a second deformation is generated between the second contact segment 12 and the body 10, and the first contact segment 11 and the second contact segment 12 are maintained in an axis of the probe element 1 while the body 10 is away from the axis of the probe element 1. That is, each of the first contact segment 11 and the second contact segment 12 is aligned with the central axis AL, and the body 10 displaced by the third guide plate 23 is away from the central axis AL, so that the probe element 1 generates resilience. In one particular embodiment, the parallel movement of the third guide plate 23 relative to the first guide plate 21 and the second guide plate 22 results in a parallel movement distance, and the parallel movement distance is less than or equal to 100 μm. Further, due to the first deformation between the first contact segment 11 and the body 10, and the second deformation between the second contact segment 12 and the body 10, the resilience generated by the probe element 1 in response to the parallel movement of the third guide plate 23 can be regarded as the first contact segment 11 and the second contact segment 12 having a first elastic force EF1 and a second elastic force EF2, respectively, in relation to the probe element 1 as a whole, and the first elastic force EF1 can be the same as or different from the second elastic force EF2, which can be adjusted according to the user's needs or practical requirements. On the other hand, when the external force F in the axial direction exceeds the critical load of the probe element 1, the peripheral portion of the center line CL of the probe element 1 drives the body 10 and the third guide plate 23 to perform the parallel movement relative to each of the first guide plate 21 and the second guide plate 22, and then each of the first through hole 211 and the second through hole 221 is aligned with the central axis AL, while the body 10 displaced by the third guide plate 23 moves the third through hole 231 away from the central axis AL.

In contrast, conventional probe testing devices include only an upper guide plate and a lower guide plate. Therefore, when the probe element correspondingly abuts the object to be tested and the substrate, the upper guide plate and the lower guide plate become misaligned, which not only causes the probe element to be unable to correspondingly and stably contact the object to be tested and the substrate, but also affects an overall electrical conductivity. In the probe testing device having the elastic structure provided by the first embodiment of the present disclosure, the first elastic force EF1 of the first contact segment 11 and the second elastic force EF2 of the second contact segment 12 in relation to the probe element 1 as a whole are independent from each other. That is, after the first contact segment 11 and the second contact segment 12 are subjected to the external force F in the axial direction, the first deformation and the second deformation respectively generated by the first contact segment 11 and the second contact segment 12 are independent and separated from each other, so that the first contact segment 11 and the second contact segment 12 are not easily to be misaligned and are able to stably contact the object to be tested and the substrate, respectively, thereby preventing the solder pad, the bump, or the solder ball on the object to be tested or the substrate from being damaged due to excessive contact pressure.

However, the aforementioned description of the first embodiment is merely an example, and is not meant to limit the scope of the present disclosure.

Second Embodiment

Figure 8A:
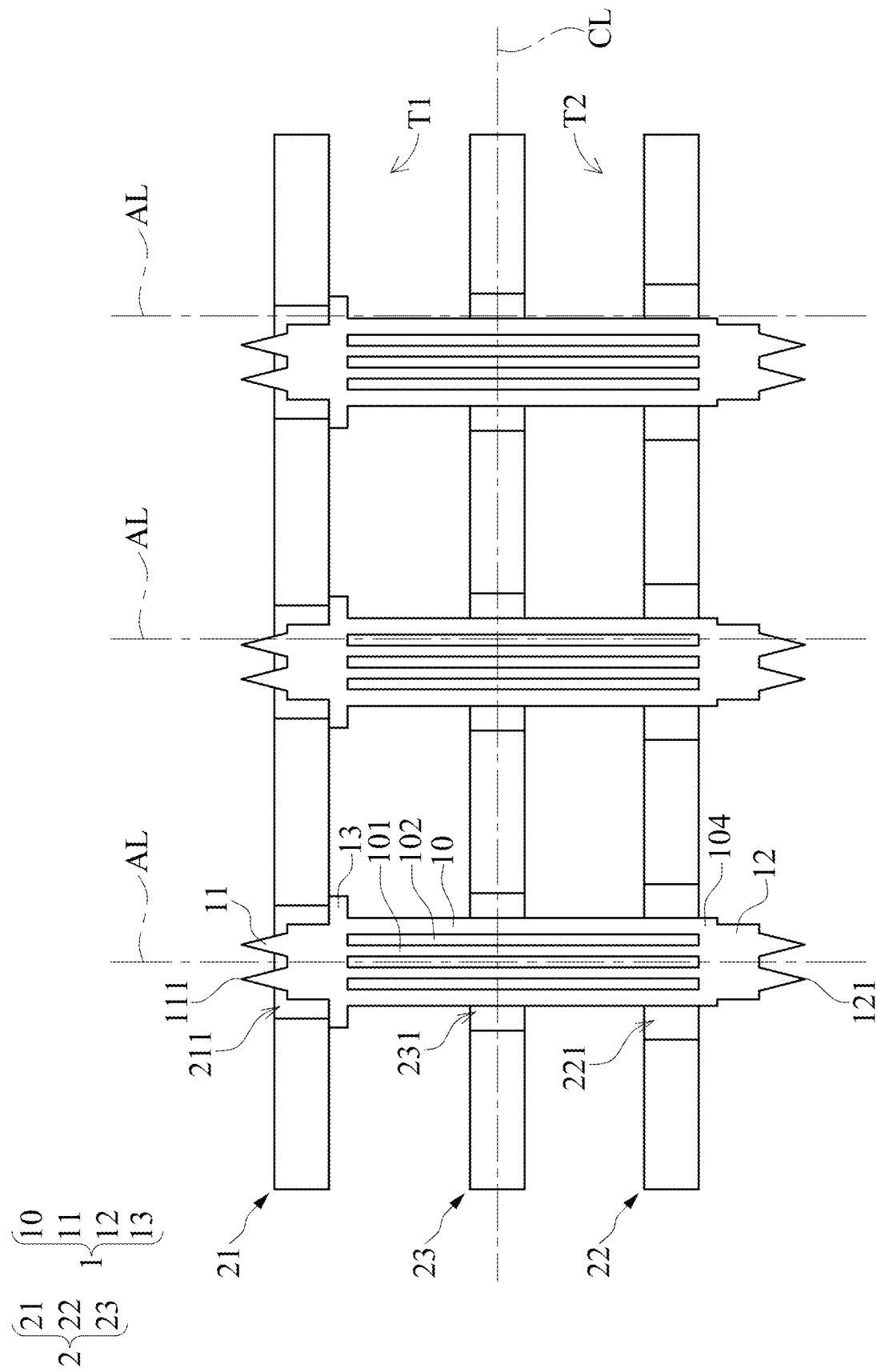
FIG. 8A to FIG. 8C are schematic cross-sectional views of a probe testing device having an elastic structure according to a second embodiment of the present disclosure.
Figure 8B:
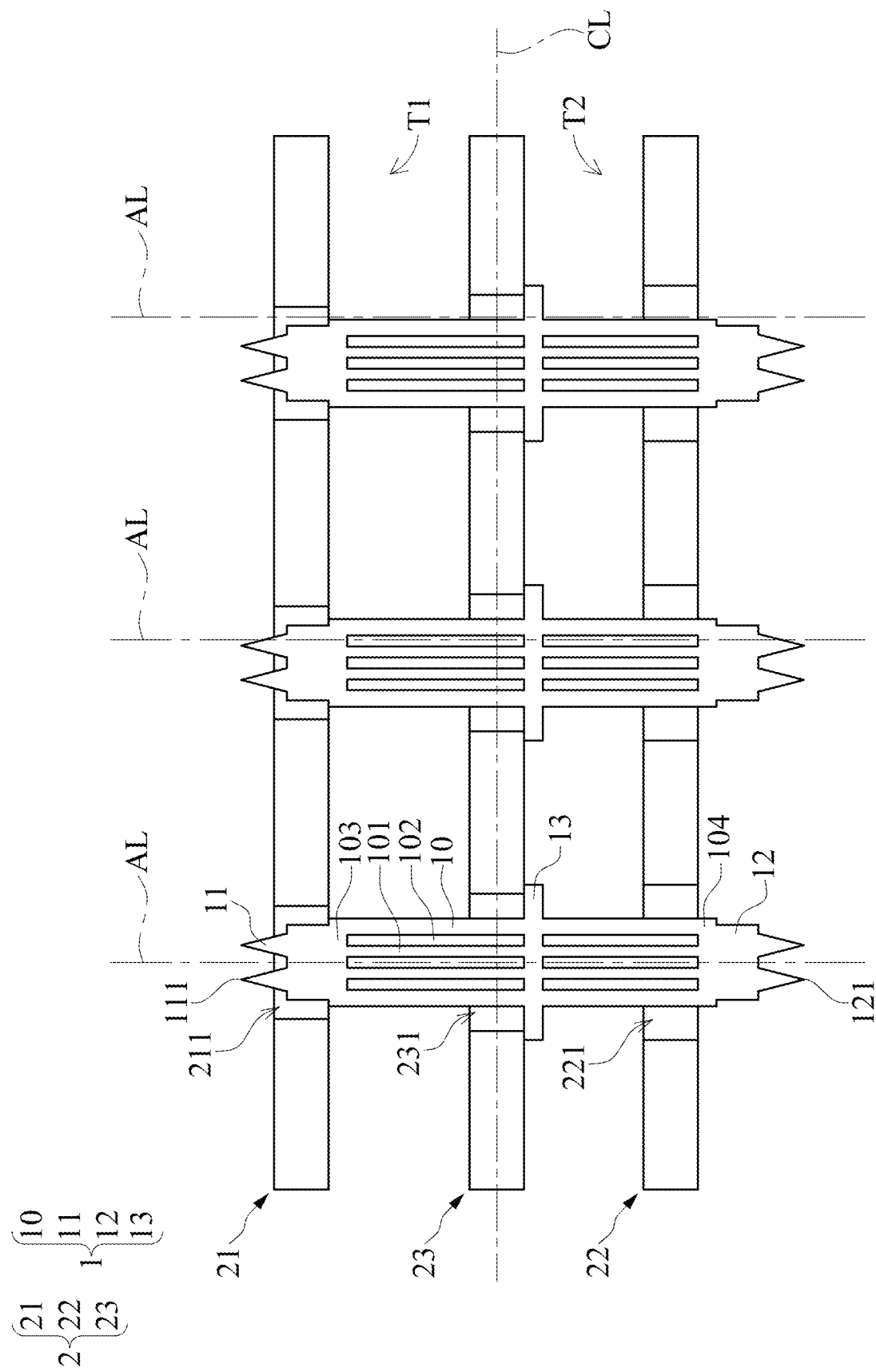
Figure 8C:
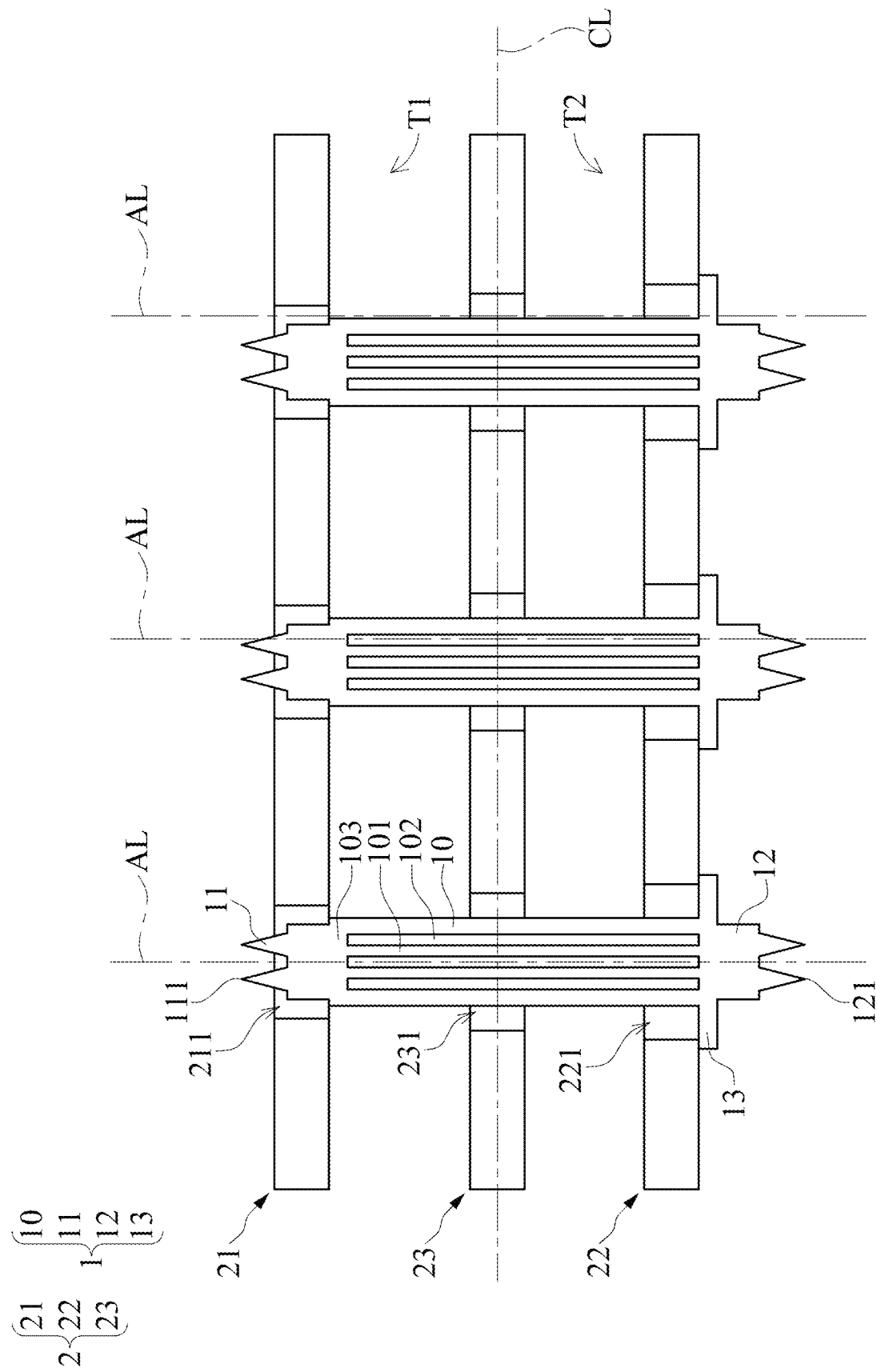

Referring to FIG. 8A to FIG. 8C, a second embodiment of the present disclosure provides a probe testing device having an elastic structure. The main difference between the second embodiment and the first embodiment is a projection of the probe element. In addition, it should be noted that, structures of a probe element and a guide plate module of the probe testing device having the elastic structure provided by the second embodiment is similar to those described in the first embodiment, which will not be iterated herein.

Specifically, the probe element 1 of the probe testing device having the elastic structure in the second embodiment of the present disclosure further includes a projection 13. The projection 13 is formed by a part protruding from the body 10 (e.g., the peripheral portion of the center line CL of the probe element 1), the first contact segment 11, or the second contact segment 12, that is, the projection 13 is arranged on an outer surface of the body 10, the first contact segment 11, or the second contact segment 12.

In the present embodiment, the projection 13 can be arranged outside a part of the first contact segment 11 corresponding to the first through hole 211, outside a part of the peripheral portion of the center line CL of the probe element 1 corresponding to the third through hole 231, or outside a part of the second contact segment 12 corresponding to the second through hole 221, and the projection 13 is arranged on one side of the first contact segment 11, the peripheral portion of the center line CL of the probe element 1, or the segment contact segment 12 that is away from the first contact end 111. That is to say, when the probe element 1 passes through the guide plate module 2 sequentially through the second through hole 221, the third through hole 231, and the first through hole 211 along the extension direction of the first contact segment 11, the projection 13 is arranged outside the part of the first contact segment 11 corresponding to the first through hole 211 and on another side of the first contact segment 11 that is adjacent to the third through hole 231, outside the part of the peripheral portion of the center line CL of the probe element 1 corresponding to the third through hole 231 and another side of the peripheral portion of the center line CL of the probe element 1 that is adjacent to the second through hole 221, or outside the part of the second contact segment 12 corresponding to the second through hole 221 and on another side of the second contact segment 12 that is adjacent to the second contact end 121, so as to determine a distance of the first contact end 11 exposed from the first guide plate 21.

The present disclosure is not limited to a shape of the projection 13. Specifically, a specific structure of the projection 13 can be adjusted according to the user's needs or the practical requirements, for example, but not limited to, a shape of a cross-section of the projection 13 can be hollow square, hollow round, hollow triangle, or arc-shaped. In addition, it is worth mentioning that, the body 10, the first contact segment 11, the second contact segment 12, and the projection 13 are integrally formed by the electrical conductor. Similarly, the body 10 the first contact segment 11, the second contact segment 12, and the projection 13 can be formed by the microelectromechanical process, the electroforming process, or the process of laser cutting.

Further, in the present embodiment, a cross-section of the first through hole 211 has a first cross-sectional area (a1), a cross-section of the second through hole 221 has a second cross-sectional area (a2), and a cross-section of the third through hole 231 has a third cross-sectional area (a3). The first cross-sectional area a1 is less than or equal to the third cross-sectional area (a3), and the third cross-sectional area (a3) is less than or equal to the second cross-sectional area (a2). In addition, a cross-section of the projection 13 and the body 10, a cross-section of the projection 13 and the first contact segment 11, or a cross-section of the projection 13 and the second contact segment 12 has a fourth cross-sectional area (A). When the projection 13 is arranged in the first contact segment 11, the fourth cross-sectional area (A) is greater than the first cross-sectional area (a1), and the fourth cross-sectional area (A) is less than each of the third cross-sectional area (a3) and the second cross-sectional area (a2). When the projection 13 is arranged in the body 10, the fourth cross-sectional area (A) is greater than each of the first cross-sectional area (a1) and the third cross-sectional area (a3), and the fourth cross-sectional area (A) is less than the second cross-sectional area (a2). When the projection 13 is arranged in the second contact segment 12, the fourth cross-sectional area (A) is greater than each of the first cross-sectional area (a1), the third cross-sectional area (a3), and the second cross-sectional area (a2). In this way, the probe element 1 is able to pass through the guide plate module 2 more stably by the projection 13 abutting against the first guide plate 21, the second guide plate 22, or the third guide plate 23.

However, the aforementioned description of the second embodiment is merely an example, and is not meant to limit the scope of the present disclosure.

Third Embodiment

Figure 9:
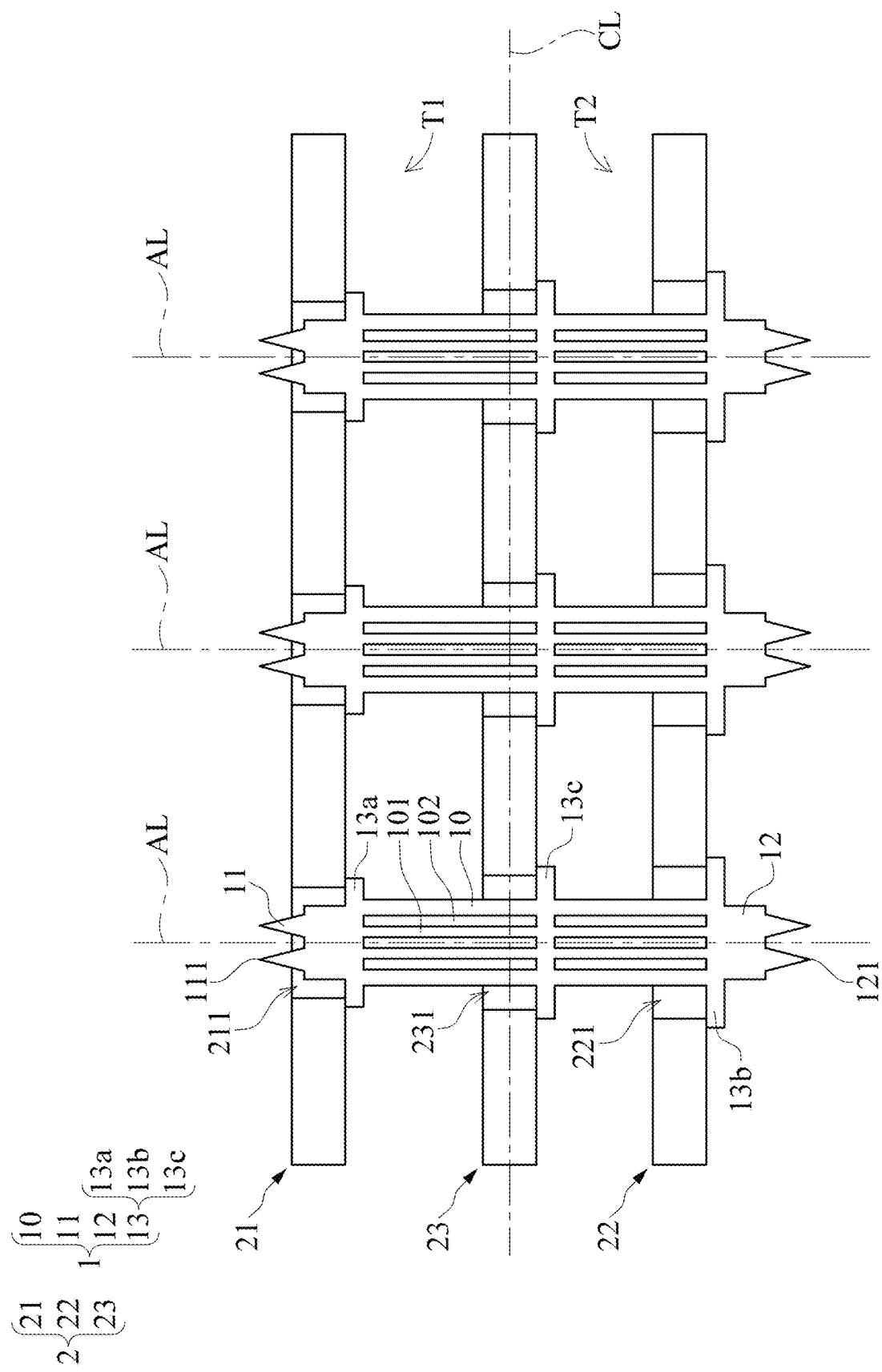
FIG. 9 is a schematic cross-sectional view of a probe testing device having an elastic structure according to a third embodiment of the present disclosure.
Figure 10:
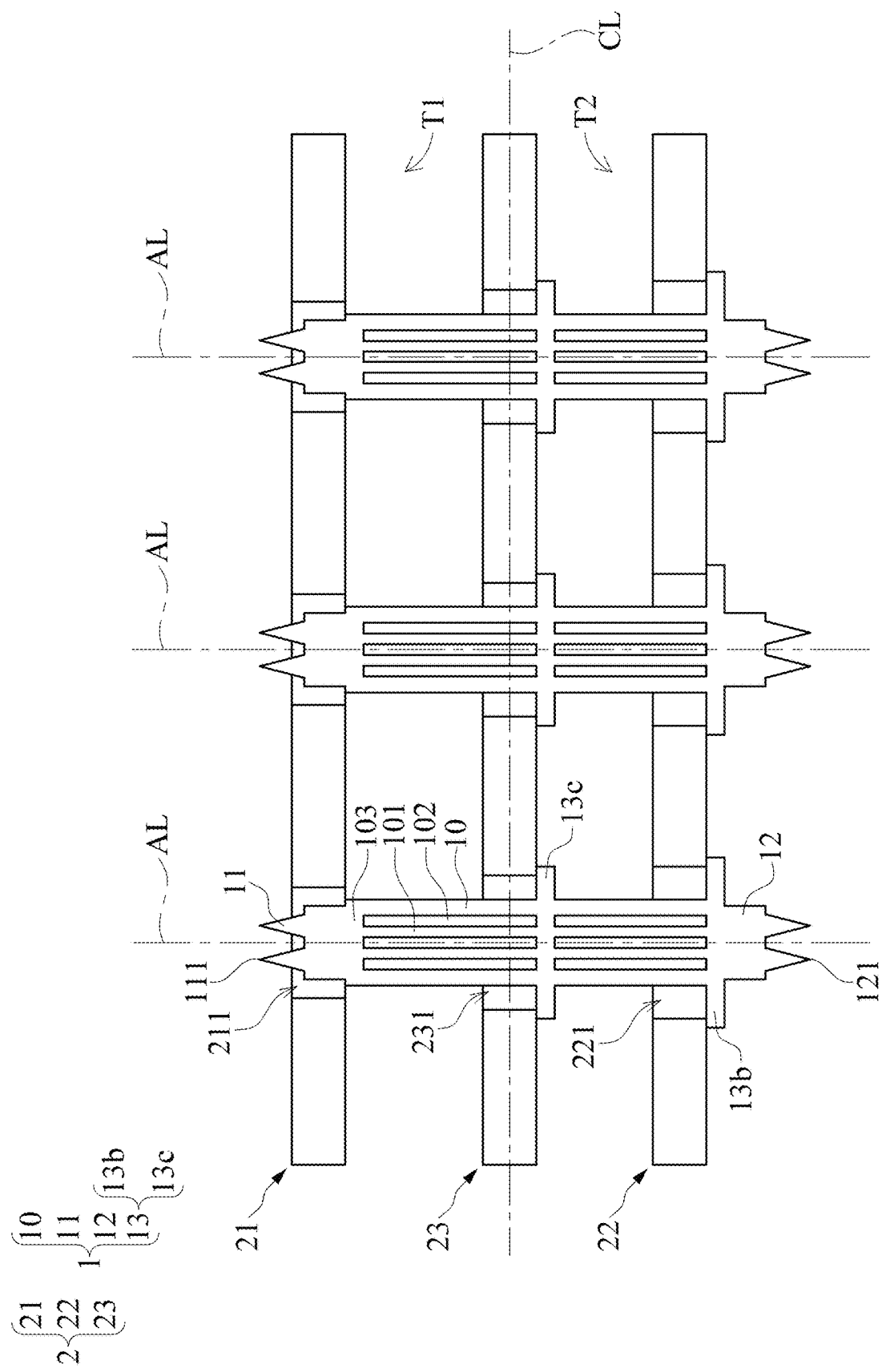
FIG. 10 another schematic cross-sectional view of the probe testing device having the elastic structure according to the third embodiment of the present disclosure.

Referring to FIG. 9 and FIG. 10, a third embodiment of the present disclosure provides a probe testing device having an elastic structure. The main difference between the third embodiment and the second embodiment is a number of the projections. In addition, it should be noted that, structures of a probe element of the probe testing device having the elastic structure provided by the third embodiment is similar to those described in the first embodiment and the second embodiment, which will not be iterated herein.

The probe element 1 of the probe testing device having the elastic structure in the third embodiment of the present disclosure further includes multiple ones of the projections 13, and the number of the projections 13 is at least two. For ease of illustration, the projection 13 arranged in the first contact segment 11 refers to a first projection 13a, the projection 13 arranged in the second contact segment 12 refers to a second projection 13, and the projection 13 arranged in the body 10 (e.g., the peripheral portion of the center line CL of the probe element 1) refers to a third projection 13c. According to the above, the probe element 1 can also include the first projection 13a and the second projection 13b, the first projection 13a and the third projection 13c, the second projection 13b and the third projection 13c, or the first projection 13a, the second projection 13b, and the third projection 13c.

As shown in FIG. 9, in an exemplary embodiment, the probe element 1 includes the first projection 13a, the second projection 13b, and the third projection 13c, that is, the projection 13 is arranged in each of the first contact segment 11, the second contact segment 12, and the body 10. Accordingly, a cross-section of the first projection 13a and the first contact segment 11 has a cross-sectional area (A1), a cross-section of the second projection 13b and the second contact segment 12 has a cross-sectional area (A2), and a cross-section of the third projection 13c and the body 10 has a cross-sectional area (A3). In addition, the cross-sectional area (A1) of the first projection 13a and the first contact segment 11 is greater than the first cross-sectional area (a1) and is less than each of the third cross-sectional area (a3) and the second cross-sectional area (a2), the cross-sectional area (A3) of the cross-section of the third projection 13c and the body 10 is greater than the third cross-sectional area (a3) and is less than the second cross-sectional area (a2), and the cross-sectional area (A2) of the cross-section of the second projection 13b and the second contact segment 12 is greater than the second cross-sectional area (a2).

As shown in FIG. 10, in one particular embodiment, the probe element 1 includes the second projection 13b and the third projection 13c, that is, the projection 13 is arranged in each of the second contact segment 12 and the body 10. Accordingly, the cross-sectional area (A3) of the cross-section of the third projection 13c and the body 10 is greater than the third cross-sectional area (a3) and is less than the second cross-sectional area (a2), and the cross-sectional area (A2) of the cross-section of the second projection 13b and the second contact segment 12 is greater than the second cross-sectional area (a2).

However, the aforementioned description of the third embodiment is merely an example, and is not meant to limit the scope of the present disclosure.

Beneficial Effects of the Embodiments

In conclusion, one of the beneficial effects of the present disclosure is that, in the probe testing device having the elastic structure provided by the present disclosure, by virtue of "the body 10 including the plurality of needle structures 101 each arranged between the first end T1 and the second end T2 that are opposite to each other, the first contact segment 11 being arranged at the first end T1, the second contact segment 12 being arranged at the second end T2, the body 10, the first contact segment 11, and the second contact segment 12 being integrally formed", "each of the plurality of probe elements 1 passing through the corresponding one of the plurality of first through holes 211, the corresponding one of the plurality of second through holes 221, and the corresponding one of the plurality of third through holes 231, so that the end of the first contact segment 11 protrudes from the first guide plate 21, the end of the second contact segment 12 protrudes from the second guide plate 22, and the central axis of the body 10 passing through the third guide plate 23", and "the third guide plate 23 being configured to perform the parallel movement relative to the first guide plate 21 and the second guide plate 22 in the direction perpendicular to the axis of each of the plurality of probe elements 1", a size of probe element can be effectively reduced and pin jamming due to misalignment under different temperatures can be avoided. In addition, a self-inductance can be effectively decreased, thereby improving accuracy and reliability of circuit testing, and extending a product life.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe testing device having an elastic structure, comprising:
   a plurality of probe elements each including:
      a first contact segment arranged at a first end of the probe element;
      a second contact segment arranged at a second end of the probe element; and
      a body arranged between the first contact segment and the second contact segment, the body including:
   a plurality of needle structures, wherein two adjacent ones of the needle structures have a gap arranged therebetween, and the plurality of the needle structures are connected to each other through the first contact segment arranged at the first end of the probe element and the second contact segment arranged at the second end of the probe element; wherein the body, the first contact segment, and the second contact segment are integrally formed; and
   a guide plate module including:
      a first guide plate having a plurality of first through holes;
      a second guide plate having a plurality of second through holes; and
      a third guide plate having a plurality of third through holes;
   wherein the first guide plate, the second guide plate, and the third guide plate are parallel to each other, the third guide plate is arranged between the first guide plate and the second guide plate, and the plurality of first through holes, the plurality of second through holes, and the plurality of third through holes correspond to each other;
   wherein each of the plurality of probe elements passes through a corresponding one of the plurality of first through holes, a corresponding one of the plurality of second through holes, and a corresponding one of the plurality of third through holes, so that an end of the first contact segment protrudes from the first guide plate, an end of the second contact segment protrudes from the second guide plate, and a central axis of the body correspondingly passes through and is perpendicular to the first guide plate, the second guide plate, and the third guide plate;
   wherein, when the third guide plate is configured to perform a parallel movement relative to the first guide plate and the second guide plate in a direction perpendicular to an axis of each of the plurality of probe elements, each of the first contact segment and the second contact segment is aligned with the central axis, and a part of the body that is displaced by the third guide plate is away from the central axis,
   wherein the first contact segment has a first elastic force, the second contact segment has a second elastic force, and the first elastic force and the second elastic force are independent from each other.

2. The probe testing device having the elastic structure according to claim 1, wherein the plurality of needle structures are parallel to each other.

3. The probe testing device having the elastic structure according to claim 1, wherein, when the third guide plate is configured to perform the parallel movement relative to the first guide plate and the second guide plate in the direction perpendicular to the axis of each of the plurality of probe elements, each of the first through hole and the second through hole is aligned with the central axis, and the third through hole that is displaced by the third guide plate is away from the central axis.

4. The probe testing device having the elastic structure according to claim 1, wherein, when the probe element is subjected to an external force, the part of the body that is displaced by the third guide plate extends in a direction of the parallel movement.

5. The probe testing device having the elastic structure according to claim 1, wherein the parallel movement of the third guide plate relative to the first guide plate and the second guide plate results in a parallel movement distance, and the parallel movement distance is less than or equal to 100 μm.

6. The probe testing device having the elastic structure according to claim 1, wherein the plurality of probe elements generates resilience in response the parallel movement of the third guide plate.

* * * * *